United States Patent
Chen et al.

(10) Patent No.: US 7,858,816 B2
(45) Date of Patent: Dec. 28, 2010

(54) TANTALUM AMIDO-COMPLEXES WITH CHELATE LIGANDS USEFUL FOR CVD AND ALD OF TAN AND TA₂0₅ THIN FILMS

(75) Inventors: Tianniu Chen, Rocky Hill, CT (US); Chongying Xu, New Milford, CT (US); Jeffrey F. Roeder, Brookfield, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 12/790,835

(22) Filed: May 30, 2010

(65) Prior Publication Data

US 2010/0240918 A1   Sep. 23, 2010

Related U.S. Application Data

(62) Division of application No. 12/013,433, filed on Jan. 12, 2008, now Pat. No. 7,750,173.

(60) Provisional application No. 60/885,459, filed on Jan. 18, 2007.

(51) Int. Cl.
 *C07F 9/00*   (2006.01)
(52) U.S. Cl. .............................. 556/42; 423/62; 257/751
(58) Field of Classification Search ................... 556/42; 423/62; 257/751
See application file for complete search history.

(56) References Cited

U.S. PATENT DOCUMENTS 2,839,421 A   6/1958   Albisetti
3,076,834 A   2/1963   Norton
3,288,829 A   11/1966  Wilinson (Continued)

FOREIGN PATENT DOCUMENTS

DE   3447635 A1   7/1985

(Continued)

OTHER PUBLICATIONS

Ainger, F.W., et al., "Deposition of ferroelectric oxides by MOCVD", "Prog. Crystal Growth and Charact.", 1991, pp. 183-197, vol. 22.

(Continued)

*Primary Examiner*—Porfirio Nazario Gonzalez
(74) *Attorney, Agent, or Firm*—Steven J. Hultquist; Intellectual Property/Technology Law; Maggie Chappuis

(57) ABSTRACT

Tantalum compounds of Formula I hereof are disclosed, having utility as precursors for forming tantalum-containing films such as barrier layers. The tantalum compounds of Formula I may be deposited by CVD or ALD for forming semiconductor device structures including a dielectric layer, a barrier layer on the dielectric layer, and a copper metallization on the barrier layer, wherein the barrier layer includes a Ta-containing layer and sufficient carbon so that the Ta-containing layer is amorphous. According to one embodiment, the semiconductor device structure is fabricated by depositing the Ta-containing barrier layer, via CVD or ALD, from a precursor including the tantalum compound of Formula I hereof at a temperature below about 400° C. in a reducing or inert atmosphere, e.g., a gas or plasma optionally containing a reducing agent.

20 Claims, 4 Drawing Sheets

U.S. PATENT DOCUMENTS

| | | |
|---|---|---|
| 3,356,527 A | 12/1967 | Moshier et al. |
| 3,437,516 A | 4/1969 | Tamborski |
| 3,467,686 A | 9/1969 | Creamer |
| 3,594,216 A | 7/1971 | Charles et al. |
| 3,988,332 A | 10/1976 | Schrock |
| 4,147,556 A | 4/1979 | Donley |
| 4,281,037 A | 7/1981 | Choung |
| 4,383,119 A | 5/1983 | Pullukat et al. |
| 4,401,474 A | 8/1983 | Donley |
| 4,491,669 A | 1/1985 | Arkles et al. |
| 4,499,198 A | 2/1985 | Pullukat et al. |
| 4,510,222 A | 4/1985 | Okunaka et al. |
| 4,529,427 A | 7/1985 | French |
| 4,726,938 A | 2/1988 | Rollat et al. |
| 4,895,709 A | 1/1990 | Laine |
| 4,898,842 A | 2/1990 | David |
| 4,908,065 A | 3/1990 | Tanitsu et al. |
| 5,003,092 A | 3/1991 | Beachley, Jr. |
| 5,008,422 A | 4/1991 | Blum et al. |
| 5,034,372 A | 7/1991 | Matsuno et al. |
| 5,043,049 A | 8/1991 | Takenaka |
| 5,084,588 A | 1/1992 | Ocheltree et al. |
| 5,085,731 A | 2/1992 | Norman et al. |
| 5,094,701 A | 3/1992 | Norma et al. |
| 5,096,737 A | 3/1992 | Baum et al. |
| 5,098,516 A | 3/1992 | Norman et al. |
| 5,110,622 A | 5/1992 | Hasegawa et al. |
| 5,120,703 A | 6/1992 | Snyder et al. |
| 5,130,172 A | 7/1992 | Hicks et al. |
| 5,139,825 A | 8/1992 | Gordon et al. |
| 5,144,049 A | 9/1992 | Norman et al. |
| 5,165,960 A | 11/1992 | Platts |
| 5,178,911 A | 1/1993 | Gordon et al. |
| 5,187,300 A | 2/1993 | Norman |
| 5,189,503 A | 2/1993 | Suguro et al. |
| 5,204,314 A | 4/1993 | Kirlin et al. |
| 5,210,254 A | 5/1993 | Ritscher et al. |
| 5,216,572 A | 6/1993 | Larson et al. |
| 5,220,044 A | 6/1993 | Baum et al. |
| 5,225,561 A | 7/1993 | Kirlin et al. |
| 5,252,518 A | 10/1993 | Sandhu et al. |
| 5,268,496 A | 12/1993 | Geisberger |
| 5,280,012 A | 1/1994 | Kirlin et al. |
| 5,322,712 A | 6/1994 | Norman et al. |
| 5,362,328 A | 11/1994 | Gardiner et al. |
| 5,374,578 A | 12/1994 | Patel et al. |
| 5,376,409 A | 12/1994 | Kaloyeros et al. |
| 5,412,129 A | 5/1995 | DiCarolis |
| 5,417,823 A | 5/1995 | Narula et al. |
| 5,424,095 A | 6/1995 | Clark et al. |
| 5,440,173 A | 8/1995 | Evans, Jr. et al. |
| 5,453,494 A | 9/1995 | Kirlin et al. |
| 5,536,323 A | 7/1996 | Kirlin et al. |
| 5,561,307 A | 10/1996 | Mihara et al. |
| 5,579,258 A | 11/1996 | Adachi |
| 5,583,205 A | 12/1996 | Rees, Jr. |
| 5,591,483 A | 1/1997 | Winter et al. |
| 5,593,741 A | 1/1997 | Ikeda |
| 5,616,755 A | 4/1997 | Seiler et al. |
| 5,668,054 A | 9/1997 | Sun et al. |
| 5,677,002 A | 10/1997 | Kirlin et al. |
| 5,679,815 A | 10/1997 | Kirlin et al. |
| 5,684,302 A | 11/1997 | Wersing et al. |
| 5,688,054 A | 11/1997 | Rabe |
| 5,705,443 A | 1/1998 | Stauf et al. |
| 5,711,816 A | 1/1998 | Kirlin et al. |
| 5,719,417 A | 2/1998 | Roeder et al. |
| 5,726,294 A | 3/1998 | Rees, Jr. |
| 5,736,422 A | 4/1998 | Lee et al. |
| 5,744,192 A | 4/1998 | Nguyen et al. |
| 5,751,540 A | 5/1998 | Lee et al. |
| 5,767,301 A | 6/1998 | Senzaki et al. |
| 5,783,716 A | 7/1998 | Baum et al. |
| 5,807,774 A | 9/1998 | Desu et al. |
| 5,817,367 A | 10/1998 | Chun et al. |
| 5,820,664 A | 10/1998 | Gardiner et al. |
| 5,820,678 A | 10/1998 | Hubert et al. |
| 5,840,897 A | 11/1998 | Kirlin et al. |
| 5,852,307 A | 12/1998 | Aoyama et al. |
| 5,859,274 A | 1/1999 | Baum et al. |
| 5,876,503 A | 3/1999 | Roeder et al. |
| 5,892,254 A | 4/1999 | Park et al. |
| 5,902,639 A | 5/1999 | Glassman et al. |
| 5,916,359 A | 6/1999 | Baum et al. |
| 5,919,522 A | 7/1999 | Baum et al. |
| 5,923,970 A | 7/1999 | Kirlin |
| 5,924,012 A | 7/1999 | Vaartstra |
| 5,932,363 A | 8/1999 | Hu et al. |
| 5,952,046 A | 9/1999 | Chayka |
| 5,955,774 A | 9/1999 | Kang |
| 5,962,884 A | 10/1999 | Hsu et al. |
| 5,972,430 A | 10/1999 | DiMeo, Jr. et al. |
| 5,973,911 A | 10/1999 | Nishioka |
| 5,976,991 A | 11/1999 | Laxman et al. |
| 5,994,571 A | 11/1999 | Zhuang et al. |
| 6,002,150 A | 12/1999 | Gardner et al. |
| 6,005,274 A | 12/1999 | Gardner et al. |
| 6,013,553 A | 1/2000 | Wallace et al. |
| 6,015,917 A | 1/2000 | Bhandari et al. |
| 6,020,243 A | 2/2000 | Wallace et al. |
| 6,020,643 A | 2/2000 | Fukuzumi et al. |
| 6,060,406 A | 5/2000 | Alers et al. |
| 6,072,207 A | 6/2000 | Yoshimori et al. |
| 6,072,689 A | 6/2000 | Kirlin |
| 6,077,356 A | 6/2000 | Bouchard |
| 6,086,779 A | 7/2000 | Bishop et al. |
| 6,099,653 A | 8/2000 | Bhandari et al. |
| 6,099,903 A | 8/2000 | Kaloyeros et al. |
| 6,102,993 A | 8/2000 | Bhandari et al. |
| 6,110,529 A | 8/2000 | Gardiner et al. |
| 6,111,124 A | 8/2000 | Baum et al. |
| 6,121,647 A | 9/2000 | Yano et al. |
| 6,126,996 A | 10/2000 | Kirlin et al. |
| 6,153,519 A | 11/2000 | Jain et al. |
| 6,159,855 A | 12/2000 | Vaartstra |
| 6,162,712 A | 12/2000 | Baum et al. |
| 6,165,802 A | 12/2000 | Cuchiaro et al. |
| 6,177,135 B1 | 1/2001 | Hintermaier et al. |
| 6,184,550 B1 | 2/2001 | Van Buskirk et al. |
| 6,191,443 B1 | 2/2001 | Al-Shareef et al. |
| 6,204,525 B1 | 3/2001 | Sakurai et al. |
| 6,214,105 B1 | 4/2001 | Hintermaier |
| 6,229,168 B1 | 5/2001 | Nakamura |
| 6,245,151 B1 | 6/2001 | Bhandari et al. |
| 6,269,979 B1 | 8/2001 | Dumont |
| 6,284,652 B1 | 9/2001 | Charneski et al. |
| 6,300,212 B1 | 10/2001 | Inoue et al. |
| 6,303,391 B1 | 10/2001 | Hintermaier et al. |
| 6,309,894 B1 | 10/2001 | Miki et al. |
| 6,337,148 B1 | 1/2002 | Xu et al. |
| 6,340,386 B1 | 1/2002 | Hendrix et al. |
| 6,342,711 B1 | 1/2002 | Van Buskirk et al. |
| 6,346,741 B1 | 2/2002 | Van Buskirk et al. |
| 6,348,412 B1 | 2/2002 | Vaartstra |
| 6,348,705 B1 | 2/2002 | Hendrix |
| 6,355,562 B1 | 3/2002 | Charneski et al. |
| 6,379,748 B1 | 4/2002 | Bhandari et al. |
| 6,399,208 B1 | 6/2002 | Baum et al. |
| 6,417,369 B1 | 7/2002 | Xu et al. |
| 6,440,202 B1 | 8/2002 | Xu et al. |
| 6,444,264 B2 | 9/2002 | Hintermaier |
| 6,500,489 B1 | 12/2002 | Hintermaier et al. |
| 6,511,706 B1 | 1/2003 | Hendrix et al. |
| 6,511,856 B2 | 1/2003 | Van Buskirk et al. |

| | | |
|---|---|---|
| 6,541,375 B1 | 4/2003 | Hayashi et al. |
| 6,552,209 B1 | 4/2003 | Lei et al. |
| 6,593,484 B2 | 7/2003 | Yasuhara et al. |
| 6,639,080 B2 | 10/2003 | Xu et al. |
| 6,645,860 B2 | 11/2003 | Charneski et al. |
| 6,660,331 B2 | 12/2003 | Hendrix et al. |
| 6,713,797 B1 | 3/2004 | Desrochers et al. |
| 6,730,523 B2 | 5/2004 | Hintermaier et al. |
| 6,736,993 B1 | 5/2004 | Xu et al. |
| 6,787,186 B1 | 9/2004 | Hintermaier |
| 6,794,703 B1 | 9/2004 | Thakur et al. |
| 6,869,638 B2 | 3/2005 | Baum et al. |
| 6,879,876 B2 | 4/2005 | O'Dougherty et al. |
| 6,900,498 B2 | 5/2005 | Stauf et al. |
| 6,951,804 B2 | 10/2005 | Seutter et al. |
| 6,960,675 B2 | 11/2005 | Chen et al. |
| 6,989,457 B2 | 1/2006 | Kamepalli et al. |
| 7,005,303 B2 | 2/2006 | Hintermaier et al. |
| 7,005,392 B2 | 2/2006 | Baum et al. |
| 7,012,292 B1 | 3/2006 | Van Buskirk et al. |
| 7,084,080 B2 | 8/2006 | Borovik et al. |
| 7,166,732 B2 | 1/2007 | Xu et al. |
| 7,198,815 B2 | 4/2007 | Chen et al. |
| 7,208,427 B2 | 4/2007 | Roeder et al. |
| 7,241,912 B2 | 7/2007 | Xu et al. |
| 7,285,308 B2 | 10/2007 | Hendrix et al. |
| 7,323,581 B1 | 1/2008 | Gardiner et al. |
| 7,329,768 B2 | 2/2008 | Kamepalli et al. |
| 7,702,418 B2 | 4/2010 | O'Dougherty et al. |
| 2002/0192952 A1 | 12/2002 | Itoh et al. |
| 2002/0197402 A1 | 12/2002 | Chiang et al. |
| 2003/0004608 A1 | 1/2003 | O'Dougherty et al. |
| 2004/0215030 A1 | 10/2004 | Norman |
| 2005/0042372 A1 | 2/2005 | Denk et al. |
| 2005/0224523 A1 | 10/2005 | O'Dougherty et al. |
| 2006/0035462 A1 | 2/2006 | Millward |
| 2006/0099831 A1 | 5/2006 | Borovik et al. |
| 2006/0102895 A1 | 5/2006 | Hendrix et al. |
| 2006/0108623 A1 | 5/2006 | Van Buskirk et al. |
| 2006/0148271 A1 | 7/2006 | Borovik et al. |
| 2006/0292303 A1 | 12/2006 | Millward et al. |
| 2007/0116876 A1 | 5/2007 | Xu et al. |
| 2007/0117385 A1 | 5/2007 | Chen et al. |
| 2008/0138984 A1 | 6/2008 | Zhang et al. |
| 2009/0004858 A1 | 1/2009 | Chen et al. |
| 2009/0032952 A1 | 2/2009 | Chen et al. |
| 2009/0087561 A1 | 4/2009 | Chen et al. |

FOREIGN PATENT DOCUMENTS

| | | | |
|---|---|---|---|
| DE | 4039449 A | | 6/1992 |
| DE | 4039449 A1 | | 6/1992 |
| EP | 0 852 229 A2 | | 7/1998 |
| EP | 1 142 894 A2 | | 10/2001 |
| GB | 976573 A | | 11/1964 |
| JP | 06-080413 A | | 3/1994 |
| JP | 06-169969 A | | 6/1994 |
| JP | 06-293778 A | | 10/1994 |
| JP | H07-263431 A | | 10/1995 |
| JP | 08-074055 A | | 3/1996 |
| JP | 08-176224 A | | 7/1996 |
| JP | 8176224 A | | 7/1996 |
| JP | 2001-044420 A | | 2/2001 |
| KR | 10-2001-008502 A | | 2/2001 |
| WO | 9801904 A1 | | 1/1998 |
| WO | 0067300 A1 | | 11/2000 |
| WO | 03050323 A1 | | 6/2003 |
| WO | 2004046417 A2 | | 6/2004 |

OTHER PUBLICATIONS

Anderson, Herbert H., "Dialkylaminogermanes and Dialkylaminosilanes", "J. Amer. Chem. Soc.", Mar. 20, 1952, pp. 1421-1423, vol. 74, No. 6.

Antinolo, A. et al., "Bonding Interactions Between Three Adjacent Hydrogen Ligands. Preparation and Spectroscopic Properties of the Tantalum..", 1988, pp. 1210-1212, vol. 17.

Antinolo, A. et al., "Exchange Coupling in Niobocene Trihydrides, Nb(C5H3RR')2H3, and Their Adducts with Copper Triad Cations . . . ", "Inorganic Chemistry", 1996, pp. 7873-7881, vol. 35, No. 26.

Awaya, Nobuyoshi, et al., "Deposition mechanism of copper CVD", "Conference Proceedings ULSI-VH", 1992, pp. 345-354, Publisher: Materials Research Society.

Banaszak Holl, Mark M., et al., "Ammonolysis of tantalum alkyls: Formation of cubic TaN and trimeric nitride, [CpMeTan]3", "Inorganic Chemistry", Apr. 18, 1990, pp. 1518-1526, vol. 29, No. 8.

Banaszak Holl, Mark M., et al., "The ladder structure of ((tert-BuCH2)2TaN)5cnt dot NH3 cnt dot 2C7H8 and its relationship to cubic tantalum nitride", "J. Amer. Chem. Soc.", Oct. 24, 1990, pp. 7989-7994, vol. 112, No. 22.

Banaszak Holl, Mark M., et al., "Conversion of [(tBuCH2)2TaN]5 to Cubic TaN: Related Syntheses, EHMO Calculations, and MAS and Spin Echo 15N NMR Spectros", "Chem. Mater.", Oct. 1996, pp. 2468-2480, vol. 8, No. 10.

Barker, James, et al., "The coordination chemistry of the amidine ligand", "Coord. Chem. Rev.", Jul. 1994, pp. 219-300, vol. 133.

Baxter, David V., et al., "Molecular Routes to Metal Carbides, Nitrides, and Oxides. 2. Studies of the Ammonolysis of Metal Dialkylamides and Hexam", "Chem. Mater.", Jun. 1996, pp. 1222-1228, vol. 8, No. 6.

Bilodeau, S. et al., "Process and Thin Film Characteristics of TaN Deposited by MOCVD", "Proceedings of the Int. Conf. on Solid State Devices and Materials", 2001, pp. 609-612, Publisher: Materials Research Society.

Blanquet, E., et al., "Evaluation of LPCVD Me-Si-N (Me=Ta, Ti, W, Re) diffusion barriers for Cu metallizations", "Microelectronic Engineering", Nov. 1997, pp. 189-195, vol. 37/38.

Bogert, L. Jean, "Chapter XVII, General classification of organic compounds", "Fundamentals of Chemistry", 1924, pp. 184-187, Publisher: WB Saunders, Published in: Philadelphia.

Bohr, Mark T., "Scaling of high performance interconnects", "Conference Proceedings ULSI XII", 1997, pp. 3-10, Publisher: Materials Research Society.

Boni, G. et al., "Tantalocene-hydride-phosphorus chemistry. Some new complexes and crystal structures . . . ", "Polyhedron", 2002, pp. 371-379, vol. 21, No. 4.

Bradley, Donald C., et al., "Metallo-organic compounds containing metal-nitrogen bonds: Part I, some dialkyamino derivatives of titanium and . . . ", "J. Chem. Soc.", Oct. 1960, pp. 3857-3861.

Bradley, Donald C., et al., "Metallo-organic compounds containing metal-nitrogen bonds: Part III, Dialkylamino compounds of tantalum", "Canadian J. Chem.", Jul. 12, 1962, pp. 1355-1360, vol. 40, No. 7.

Bradley, D.C., et al., "Nuclear magnetic resonance studies on niobium and tantalum penta-alkoxides", "J. Chem. Soc. (A)", 1968, pp. 219-223.

Bradley, Donald C., et al., "Transition-metal dialkylamides and disilylamides", "Accounts of Chemical Research", 1976, pp. 273-280, vol. 9.

Buerger, Hans, et al., "Titanium-nitrogen compounds 9 Tris(dialkylamino)titanium derivatives of phosphorus and arsenic", "CA: 72:132915, abstract of Inorganic and Nuclear Chemistry Letters", 1970, pp. 299-304, vol. 6, No. 3.

Carmalt, CJ, et al., "Synthesis of titanium(IV) guanidinate complexes and the formation of titanium carbonitride via low-pressure chemical vap", "Inorganic Chemistry", Feb. 7, 2005, pp. 615-619, vol. 44, No. 3.

Castro, A. et al., "Mixed-dicyclopentadienyl niobium and tantalum complexes: synthesis and reactivity. X-ray molecular structures . . . ", "Journal of Organometallic Chemistry", 1996, pp. 37-46, vol. 518, No. 1-2.

Catania, Phillip, et al., "Low resistivity body-centered cubic tantalum thini films as diffusion barriers between copper and silicon", "J. Vac. Sci. Tech. A", 1992, pp. 3318-3321, vol. A10.

Chao, Yuan-Wei, et al., "Preparation and properties of tantalum imido complexes and their reactions with alkynes. Coordination control through . . . ", "Inorganic Chemistry", Oct. 4, 1989, pp. 3860-3868, vol. 28, No. 20.

Chao, Yuan-Wei, et al., "Preparation and properties of amido halide complexes of niobium and tantalum and their reactions with alkynes ", "Polyhedron", 1990, pp. 2709-2716, vol. 9, No. 22.

Chen, C. et al., "Synthesis and catalytic properties of oxalic amidinato complexes", "J. Chem. Society, Dalton Trans.", May 15, 2001, pp. 1761-1767, Publisher: The Royal Scociety of Chemistry.

Cheon, Jinwoo, et al., "Gas Phase Photoproduction of Diatomic Metal Nitrides During Metal Nitride Laser Chemical Vapor Deposition", "Inorg. Chem.", May 3, 1999, pp. 2238-2239, vol. 38, No. 9.

Chi, K. M., et al., "Synthesis and characterization of (beta-diketonato)copper(I)alkyne complexes: structural characterization of . . . ", "Inorganic Chemistry", Nov. 13, 1991, pp. 4293-4294, vol. 30, No. 23, Publisher: American Chemical Society.

Chisholm, Malcom H., et al., "Chloro(dimethylamido) compounds of tantalum(V): Preparation, properties, and structures of [Ta(NMe2)3CI2]2, . . . ", "Inorganic Chemistry", Jun. 1, 1981, pp. 1859-1865, vol. 20, No. 6.

Chiu, Hsin-Tien, et al., "Effect of hydrogen on deposition of tantalum nitride thin films from ethylimidotantalum complex", "J. of Mater. Sci. Lett.", Jan. 1992, pp. 570-572, vol. 11, No. 9.

Chiu, Hsin-Tien, et al., "Deposition of tantalum nitride thin films from ethylimidotantalum complex", "J. Mater. Sci. Lett.", Jan. 1992, pp. 96-98, vol. 11, No. 2.

Chiu, Hsin-Tien, et al., "Tungsten nitride thin films prepared by MOCVD", "J. Mater. Res.", Jun. 1993, pp. 1353-1360, vol. 8, No. 6.

Cotton, F. A., et al., "Experimental and theoretical studies of the copper(I) and silver(I) dinuclear N,N-di-p-tolylformamidinato complexes", "J. Am. Chem. Soc.", 1988, pp. 7077-7083, vol. 110, No. 21.

Cummins, Christopher C., et al., "Synthesis of Terminal Vanadium(V) Imido, Oxo, Sulfido, Selenido, and Tellurido Complexes by Imido Group or Chalcogenide", "Inorganic Chemistry", Mar. 30, 1994, pp. 1448-1457, vol. 33, No. 7.

Deutschler, R.L., et al., "Eight coordinate tetrakis-chelate complexes of niobium(IV) and tantalum(IV)", "Inorganica Chimica Acta", 1970, pp. 645-650, vol. 4, No. 4.

Dias, H.V. Rasika, et al., "Coinage metal complexes of 3,5-bis(trifluoromethyl)pyrazolate ligand Synthesis and characterization . . . ", "J. Fluor. Chem.", Apr. 24, 2000, pp. 163-169, vol. 103, No. 2.

Edelmann, Frank T., "N-silyated benzamidines_versatile building blocks in main group and coordination chemistry", "Coord. Chem. Rev.", Dec. 1994, pp. 403-481, vol. 137.

Engbrecht, E. et al., "Chemical vapor deposition growth and properties of TaCxNy", "Thin Solid Films", 2002, pp. 145-150, vol. 418.

Fan, M. et al., "Peculiar Hydride-Silyl Interactions in Group 5 Bent Metallocene Complexes, Studied by ab Initio Calculations", "Organometallics", 1998, pp. 1092-1100, vol. 17, No. 6.

Fix, Renaud, et al., "Chemical vapor deposition of vanadium, niobium, and tantalum nitride thin films", "Chem. Mater,", May 1993, pp. 614-619, vol. 5, No. 5.

Foust, D. et al., "Photodegradation studies on di-n5-cyclopentadienyldimethyl-tantalum and some deuterated analogs ", "Journal of Organometallic Chemistry", 1982, pp. 47-55, vol. 226, No. 1.

Fuggle, J.C., et al., "Reactions of Niobium and Tantalum Pentafluorides with Trimethylsilyldiethylamine and with Trimethylsilyl Chloride", "J. Chem. Soc. Dalton Trans.", 1972, pp. 1766-1768.

Gade, L. et al., "New transition metal imido chemistry with diamido-donor ligands", "Coordination Chemistry Reviews", 2001, pp. 65-97, vol. 216-217.

Gilles, S., et al., "Deposition of (Ti,Al)N thin films by organometallic chemical vapor deposition: thermodynamic predictions and . . . ", "Surface and Coatings Technol.", Oct. 1997, pp. 285-290, vol. 94-95.

Gilman, Norman W., et al., "Extension of the Smiles rearrangement. Displacement of an aromatic amide group by an amine nitrogen", "J. Org. Chem.", Jan. 26, 1973, pp. 373-377, vol. 38, No. 2.

Girolami, Gregory S., et al., "Chemical vapor deposition of copper and copper oxide thin films for copper(I) tert-butoxide", "Chemistry of Materials", 1989, pp. 8-10, vol. 1.

Gordon, Roy G., et al., "Silicon dimethylamido complexes and ammonia as precursors for the atmospheric pressure chemical vapor deposition of . . . ", "Chem. Mater.", Sep. 1990, pp. 480-482, vol. 2, No. 5.

Hieber, K., "Structural and electrical properties of Ta and Ta nitrides deposited by chemical vapour deposition", "Thin Solid Films", Nov. 1974, pp. 157-164, vol. 24, No. 1.

Hiskes, R., et al., "Single source metalorganic chemical vapor deposition of low microwave surface resistance YBa2Cu3O7", "Applied Physics Letters", Jul. 29, 1991, pp. 606-607, vol. 59, No. 5.

Holloway, Karen, et al., "Tantalum as a diffusion barrier between copper and silicon: Failure mechanism and effect of nitrogen additions", "Journal of Applied Physics", Jun. 1, 1992, pp. 5433-5444, vol. 71, No. 11.

Houle, F. A., et al., "Laser chemical vapor deposition of copper", "Appl. Phys. Lett.", 1985, pp. 204-206, vol. 46.

Im, S. et al., "A Study on CVD TaN as a Diffusion Barrier for Cu Interconnects", "Mat. Res. Symp. Proc.", 2000, pp. D671-D676, vol. 612, Publisher: Materials Research Society.

Jacini, Giovanni, "Organic derivatives of titanium", "CA: 49:19704, abstract of Olii Minerali, Grassi e Saponi, Colori e Vernici", 1953, pp. 193-194, vol. 30.

Jain, A., et al., "Chemical vapor deposition of copper via disproportionation of hexafluoroacetylacetonato(1,5-cyclooctadiene)copper(I) . . . ", "Journal of Materials Research", Feb. 1992, pp. 261-264, vol. 7, No. 2, Publisher: Materials Research Society.

Jiang, Qian, et al., "Synthesis of mono- and bis(silyl) complexes of tantalum", "Organometallics", Oct. 1991, pp. 3648-3655, vol. 10, No. 10.

Jiang, Q. et al., "Thermochemical Aspects of Arene C-H Activation by Tantalum Silyl Complexes: Relative Ta-Si and Ta-C bond enthalpies", "Journal of Organometallic Chemistry", Sep. 1994, pp. 3679-3691, vol. 13, No. 9.

Jones, Anthony C., et al., "MOCVD of zirconia thin films by direct liquid injection using a new class of zirconium precurser", "Chemical Vapor Deposition", Dec. 1998, pp. 46-49, vol. 4, No. 2.

Juza, R., et al., "Ammonothermal synthesis of magnesium and berylium amides", "Angew. Chem. Interntl. Ed.", 1966, p. 247 vol. 5, No. 2.

Kaloyeros, Alain E., et al., "Low-temperature metal-organic chemical vapor deposition (LTMOCVD) of device-quality copper films for microelectronic . . . ", "Journal of Electronic Materials", Mar. 1990, pp. 271-276, vol. 19, No. 3, Publisher: The Minerals, Metals & Materials Society and the Institute of Electrical and Electronics Engineers.

Kannengiesser, Gerard, et al., "Preparation de quelqes tetra(dialcoylamino)silanes", "Bull. Soc. Chim. Fr.", Jul. 1967, pp. 2492-2495, vol. 322, No. 7.

Kapoor, P.N., et al., "Organic compounds of niobium and tantalum IV. Reactions of niobium and tantalum pentaethoxides with Beta-diketones", "Journal of the Less-Common Metals", May 1965, pp. 339-346, vol. 8, No. 5.

Kee, Terence P., "Tantalum", "Coordination Chemistry Reivews", Jan. 1995, pp. 181-194, vol. 138.

Kilner, Melvyn, et al., "Studies of Amidino-Complexes of Copper(I) and (II). Carboxylate Analogues", "Polyhedron", 1983, pp. 1379-1388, vol. 2, No. 12, Publisher: Pergamon Press Ltd., Published in: Great Britain.

Kim, H. et al., "Diffusion Barrier Properties of Transition Metal Thin Fims Grown by Plasma-Enhanced Atomic-Layer Deposition", "J. Vac. Sci. Technology", Jul. 2002, pp. 1321-1327, vol. 20, No. 4.

Kim, H. et al., "Growth of Cubic TaN Thin Films by Plasma-Enhanced Atmic Layer Deposition", "J. Applied Physics", Dec. 15, 2002, pp. 7080-7086, vol. 92, No. 12.

Kolawa, E., et al., "Tantalum-based diffusion barriers in Si/Cu VLSI metallizations", "Journal of Applied Physics", Aug. 1, 1991, pp. 1369-1373, vol. 70, No. 3.

Lappert, M.F., et al., "Metal and Metalloid Amides", pp. 470-543, Publisher: John Wiley and Sons, (A Diligent Effort was Made to Locate This Reference, Including Contacting the British Library, Without Success. This Reference Was Cited in U.S. Patent No. 6,015,917, and the Examiner is Directed to the File History to Obtain same).

Leblanc, J. et al., "Coordination Chemistry.—Substituted Biscyclopentadienyl Tantale Complexes: Synthesis and Reactivity of Dicholorides . . . ", 1982, pp. 755-757, vol. 295, No. 8.

Li, Jian, et al., "Copper-based metallization in ULSI structures", "MRS Bulletin", Aug. 1994, pp. 15-18, vol. XIX, No. 8.

Li, Wentao, et al., "Additives for stabilizing LiPF6-based electrolyes against thermal decomposition", "J. Electrochem. Soc.", 2005, pp. A1361-A1365, vol. 152, No. 7.

Lim, Booyong S., et al., "Synthesis and Characterization of Volatile, Thermally Stable, Reactive Transition Metal Amidinates", "Inorg. Chem.", Dec. 1, 2003, pp. 7951-7958, vol. 42, No. 24.

Lim, Booyong S., et al., "Atomic layer deposition of transition metals", "Nature Materials", Nov. 2003, pp. 749-754, vol. 2, No. 11.

Lim, S. et al., "A Study on the Development of Chemical Vapor Deposition Precursors. 4. Syntheses and Characterization of New N-Alkoxoy..", "Chem. Mater.", 2002, pp. 1548-1554, vol. 14, Publisher: American Chemical Society.

Linde, Von G., et al., "IR-spektren von amiden und imiden zwei- und dreiwertiger metalle", "Z. anorg. allg. Chem.", 1974, pp. 199-214, vol. 409.

Maruyama, Toshiro, et al., "Silicon dioxide thin films prepared by chemical vapor deposition from tetrakis (diethylamino)silane and ozone", "Appl. Phys. Letters", May 23, 1994, pp. 2800-2802, vol. 64, No. 21.

Maruyama, Toshiro, "Electrical Characterization of Silicon Dioxide Thin Films Prepared by Chemical Vapor Deposition from . . . ", "Jpn. J. Appl. Phys.", Jul. 15, 1997, pp. L922-L925, vol. 36, No. 7B.

McLain, S.J., et al., "Multiple metal-carbon bonds. 6. The reaction of niobium and tantalum neopentylidene complexes with simple olefins: . . . ", "J. Amer. Chem. Soc.", May 11, 1977, pp. 3519-3520, vol. 99, No. 10.

Murarka, S.P., et al., "Advanced multilayer metallization schemes with copper as interconnection metal", "Thin Solid Films", Dec. 15, 1993, pp. 257-266, vol. 236, No. 1-2.

Narula, A.K., et al., "Preparation and characterization of nobium (V) beta-diketonates", "Synth. React. Inorg. Met. Org. Chem.", 1983, pp. 1-19, vol. 13, No. 1.

Narula, A.K., et al., "Preparation and Characterization of Tantalum(V) beta-Diketonates (Part II)", "Synth. React. Inorg. Met.-Org. Chem.", 1983, pp. 887-898, vol. 13, No. 7.

"Adherent and stable metallization of CVD diamond", "Nasa Tech Briefs", Jun. 1997, pp. 63-64.

"Diffusion barriers for GaAs and InP devices", "Nasa Tech Briefs", Jun. 1997, p. 42.

Norman, J. A. T., et al., "New OMCVD precursors for selective copper metallization", "Journal de Physique IV, Colloque C2, Suppl. Au Journal de Physique II", Sep. 1991, pp. 271-278, vol. 1.

Nugent, William A., et al., "Structure and reactivity in the group b t-butylimido complexes (Me2N)3_NBut; X-ray crystal and molecular structure of.", "JCS Chem. Comm.", 1978, pp. 579-580.

Nugent, William A., "Synthesis of some d0 organoimido complexes of the early transition metals", "Inorg. Chem.", Mar. 16, 1983, pp. 965-969, vol. 22, No. 6.

Oakley, Sarah H., et al., "Structural consequences of the prohibition of hydrogen bonding in copper-guanidine systems", "Inorg. Chem.", 2004, pp. 5168-5172, vol. 43, No. 16.

Oehr, C., et al., "Thin copper films by plasma CVD using copper-hexafluoro-acetylacetonate", "Applied Physics A: Solids and Surfaces", Feb. 1988, pp. 151-154, vol. 45, No. 2.

Olowolafe, J.O., et al., "Interdiffusions in Cu/reactive-ion-sputtered TiN, Cu/chemical-vapor-deposited TiN, Cu/TaN, and TaN/Cu/TaN thin-film . . . ", "Journal of Applied Physics", Nov. 1, 1992, pp. 4099-4103, vol. 72, No. 9.

Ohshita, Yoshio, et al., "HfO2 growth by low-pressure chemical vapor deposition using the Hf(N(C2H5)2)4/O2 gas system", "J. Cryst. Growth", Nov. 2001, pp. 292-297, vol. 233, No. 1-2.

Ovchinnikov, Yu. E., et al., "The crystal structures of the titanium-containing organosilicon compounds (SiMe3)3 and (SiMe3)3GeTi(Nme2)3", "Metalloorg. Khim, (Organometallic Chem. In USSR)", 1992, pp. 564-567, vol. 5, No. 5.

Ovchinnikov, Yu E., et al., "Crystal and molecular structure of organosilicon derivatives of titanium (IV) (Me3Si)3SiTi(NEt2)3, and ClTi[N(SiMe3)2]3", "CA: 125:100729, abstract of Izvestiya Akademii Nauk, Seriya Khimicheskaya", 1993, pp. 1473-1476, vol. 8.

Papadopoulos, E.P., "Reaction of o-amononitriles with isocyanates. 2. A facile synthesis of imidazo[1,2-c]quinazoline-2,5-(3H,6H)dione", "J. Heterocyclic Chem.", May 1981, pp. 515-518, vol. 18.

Park, J. et al., "Plasma-Enhanced Atomic Layer Deposition of Tantalum Nitrides Using Hydrogen Radicals as a Reducing Agent", "Electrochemical and Solid State Letters", Mar. 9, 2001, pp. C17-C19, vol. 4, No. 4.

Park, J. et al., "Plasma-Enhanced Atomic Layer Deposition of TaN Thin Films", "Journal of the Electrochemical Society", Nov. 27, 2001, pp. C28-C32, vol. 1.

Parkin, G. et al., "Alpha- and beta-migratory insertion and elimination processes for alkyl complexes of permethylscandocene and permethylta", "Journal of Molecular Catalysis", 1987, pp. 21-39, vol. 41, No. 1-2.

Phule, Pradeep P., "Sol-gel sythesis of ferroelectric lithium tantalate ceramics: FTIR investigation of the molecular modification of . . . ", "J. Mater. Res.", Feb. 1993, pp. 334-338, vol. 8, No. 2.

Protasiewicz, John D., et al., "Synthesis and structural characterization of low-valent Group V phosphine complexes", "Inorganic Chemistry", Sep. 30, 1992, pp. 4134-4142, vol. 31, No. 20.

Reisman, A., et al., "Chemical vapor deposition of copper from copper (II) hexafluoroacetylacetonate", "J. Electrochemical Soc.", Nov. 1989, pp. 3525-3529, vol. 136, No. 11.

Riley, P. et al., "Formation of Tantalum 'Tuck-in' Complexes by Activation of Methyl-C-H Bonds in Pentamethylcyclopentadiene Groups . . . ", "Organometallics", Aug. 12, 1999, pp. 3579-3583, vol. 18.

Co-pending U.S. Appl. No. 12/773,650.

Rossnagel, S.M., et al., "Thin, high atmonic weight refractory film deposition for diffusion barrier, adhesion layer, and seed layer applications", "J. Vac. Sci. Technol. B", May/Jun. 1996, pp. 1819-1827, vol. 14, No. 3.

Rossnagel, S.M., et al., "Thin, high atomic weight refractory film deposition for diffusion barrier, adhesion layer, and seed layer applications", "J. Vac. Sci. Technol. B", May 1996, pp. 1819-1827, vol. 14, No. 3.

Sabo-Etienne, S. et al., "Synthesis, X-Ray crystal structure, NMR characterization and theoretical calculations on [Cp2Ta(n2-H2)(CO)]+, the first", "New J. Chem", Nov. 28, 2000, pp. 55-62, vol. 25.

Schrock, Richard R., et al., "Multiple Metal-Carbon Bonds. 8. a Preparation, Characterization, and Mechanism of Formation of the Tantalum and . . . ", "J. Amer. Chem. Soc.", May 24, 1978, pp. 3359-3370, vol. 100, No. 11.

Schrock, Richard R., "Alkylidene complexes of niobium and tantalum", "Accounts of Chemical Research", Mar. 1979, pp. 98-104, vol. 12, No. 3.

Shibayama, Koichi, et al., "Living Polymerization of Carbodiimides Initiated by Copper(I) and Copper(II) Amidinate Complexes", "Macromolecules", Jun. 2, 1997, pp. 3159-3163, vol. 30, No. 11.

Shin, H. K., et al., "Chemistry of Copper(I) beta-diketonate complexes. 2. synthesis, characterization, and physical properties of . . . ", "Inorganic Chemistry", Feb. 5, 1992, pp. 424-431, vol. 31, No. 3, Publisher: American Chemical Society.

Shin, H.K., et al., "MOCVD of Titanium Nitride from a New Precursor, Ti[N(CH3)C2H5]4 ", "Chem. Mater.", Jan. 1997, pp. 76-80, vol. 9, No. 1.

Simmonds, M.G, et al., "Chemical vapor deposition of aluminum", "The Chemistry of Metal CVD, Kodas, T. and Hampden-Smith, M. (eds)", 1994, pp. 48-103, Publisher: VCH Publishers, Published in: New York.

Small, M.B., et al., "On-chip wiring for VLSI: Status and directions", "IBM J. Res. Dev.", Nov. 1990, pp. 858-867, vol. 34, No. 6.

Stolz, M., et al., "Universal chemical vapour deposition system for metallurgical coatings", "Thin Solid Films", Feb. 18, 1983, pp. 209-218, vol. 100, No. 3.

Sugiyama, Kozoh, et al., "Low temperature deposition of metal nitrides by thermal decomposition of organometallic compounds", "J. Electrochem. Soc.", Nov. 1975, pp. 1545-1549, vol. 122, No. 11.

Sun, Xin et al., "Properties of reactively sputter-deposited Ta-N thin films", "Thin Solid Films", 1993, pp. 347-351, vol. 236.

Sun, S.C., et al., "Diffusion barrier properties of CVD tantalum nitride for aluminum and copper interconnections", "VMIC Conference, ISMIC", Jun. 27-29, 1995, pp. 157-161.

Sun, S.C., et al., "Performance of MOCVD tantalum nitride diffusion barrier for copper metallization", "1995 Symp. on VLSI Technol. Digest of Technical Papers", Jun. 1995, pp. 29-30.

Suzuki, Toshiya, et al., "Comparison of CVD TiN, PECVD WNx, and CVD W-Si-N as upper electrode materials for Ta2O5 DRAM capacitors", "Advanced Metallization Conference", Sep. 28, 1997, Published in: San Diego.

Tabuchi, Toshiya, et al., "Application of penta-di-methyl-amino-tantalum to a tantalum source in chemical vapor deposition of tantalum oxide films", "Japanese Journal of Applied Physics", Nov. 1991, pp. L1974-L1977, vol. 30, No. 11B.

Tilley, T. Don, "The Reactivity of Transition Metal-Silicon Compounds", "Final Technical Report, AD No. A200371", Aug. 8, 1988, Publisher: Defense Technical Information Center.

Tilley, T Don., "Transition-metal silyl derivatives", "The Chemistry of Organic Silicon Compounds, Patai, Saul and Rappaport, Zvi (eds)", 1989, pp. 1415-1477, Publisher John Wiley & Sons, Published in: New York.

Tin, M. et al., "Insertion Routes to Tetrasubstituted Guanidinate Complexes of Ta(V) and Nb(V)", "Inorganic Chemistry", Feb. 18, 1999, pp. 998-1001, vol. 38.

Tsai, M.H., et al., "Metalorganic chemical vapor deposition of tantalum nitride by tertbutylimidotris(diethylamido) tantalum for advanced . . . ", "Appl. Phys. Lett.", Aug. 21, 1995, pp. 1128-1130, vol. 67, No. 8.

Tsai, M.H., et al., "Metal-organic chemical vapor deposition of tantalum nitride barrier layers for ULSI applications", "Thin Solid Films", Dec. 1, 1995, pp. 531-536, vol. 270, No. 1-2.

Turner, Howard W., et al., "Tantalum complexes containing diimido bridging dinitrogen ligands", "J. Amer. Chem. Soc.", Dec. 17, 1980, pp. 7809-7811, vol. 102, No. 26.

Ugolini, D., et al., "Photoelectron spectroscopy studies of chemical vapor deposition of Ta from a TaF5 precursor on Si and SiO2 substrates", "Journal of Applied Physics", Oct. 1, 1991, pp. 3899-3906, vol. 70, No. 7.

Uhlig, Wolfram, "Darstellung neuartiger monomerer, oligomerer und polymerer Silyltriflate", "Chem. Ber.", 1992, pp. 47-53, vol. 125.

Zhang, Jiming, et al., "Metal organic chemical vapor deposition of LaSrCoO electrodes for ferroelectric capacitors", "6th ISAF Mtg.", Mar 1994.

Zinn, Alfred A., et al., "Chemical vapor deposition of platinum, palladium and nickel", "The Chemistry of Metal CVD, Kodas, T. and Hampden-Smith, M. (ed.)", 1994, pp. 330-339, Publisher: VCH Publishers, Published in: New York.

Van Vliet, P.I., et al., "Complexes of N,N1-substituted formamidines I. Compounds [M(RNC(H)NR1)]n (M=CuI, AgI; R=p-Tolyl; R'=Alkyl; n=2,4)", "J. Organomet. Chem.", Oct. 9, 1979, pp. 89-100, vol. 179, No. 1.

Van Buskirk, Peter C., et al., "MOCVD growth of BaTiO3 in an 8-inch single-wafer CVD reactor", "Proc. ISAF, Eighth Int'l Symp. Appl. Ferroelectrics", Aug. 31-Sep. 2 1992, vol. 92.

Van Hermert, R. L., et al., "Vapor deposition of metals by hydrogen reduction of metal chelates", "J. Electrochemical Soc.", 1965, pp. 1123-1126, vol. 112, No. 11.

Vossen, John L. and Kern, Werner, Eds., "Thin Film Process II", 1991, p. 763, Publisher: Academic Press, Published in: Boston, Massachusetts.

Wan, Yanjian, et al., "Hydride and Fluoride Transfer Reactions Accompanying Nucleophilic Substitution at Pentacoordinate Silicon", "J. Amer. Chem. Soc.", Jan. 11, 1995, pp. 141-156, vol. 117, No. 1.

Wang, Shi-Qing, et al., "Step coverage comparison of Ti/TiN deposited by collimated and uncollimated physical vapor deposition techniques", "J. Vac. Sci. Technol. B", May 1996, pp. 1846-1852, vol. 14, No. 3.

Wang, Shi-Qing, "Barriers against copper diffusion into silicon and drift through silicon dioxide", "MRS Bulletin", Aug. 1994, pp. 30-40.

Wang, Shi-Qing, et al., "Film property comparison of Ti/TiN deposited by collimated and uncollimated physical vapor deposition techniques", "J. Vac. Sci. Technol. B", May/Jun. 1996, pp. 1837-1845, vol. 14, No. 3.

Werner, Robert P.M., et al., "Tetracarbonylcyclopentadienyl Compounds of the Group V Transition Metals", "Inorganic Chemistry", Feb. 1964, pp. 298-300, vol. 3, No. 2.

Williams, David N., et al., "Half-sandwich imido complexes of niobium and tantalum", "J. Chem. Soc. Dalton Trans", 1992, pp. 739-751.

Winter, Charles H., "Single-source precursors to niobium nitride and tantalum nitride films", "Mat. Res. Soc. Symp. Proc.", 1994, pp. 103-108, vol. 327, No. 1.

Winter, Charles H., "The chemical vapor deposition of metal nitride films using modern metalorganic precursors", "Aldrichchimica Acta", 2000, pp. 3-12, vol. 33, No. 1.

Xue, Z., et al., "Early-Transition-Metal Silyl Complexes Free from Anionic r-Ligands. A New Family of Alkyl, Alkylidene, and Alkylidyne . . . ", "J. Amer. Chem. Soc.", Mar. 9, 1994, pp. 2169-2170, vol. 116, No. 5.

Yam, Chi Ming, et al., "Simple Acid-Base Hydrolytic Chemistry Approach to Molecular Self-Assembly: Thin Films of Long Chain Alcohols . . . ", "Langmuir", Nov. 24, 1998, pp. 6941-6947, vol. 14, No. 24.

Zhang, Jiming, et al., "Single liquid source plasma-enhanced metalorganic chemical vapor deposition of high quality YBa2Cu3O7-x thin films", "Applied Physics Letters", Dec. 14, 1992, pp. 2884-2886, vol. 61, No. 24.

Zhang, Jiming, et al., "Plasma enhanced metalorganic chemical vapor deposition of conductive oxide electrodes for ferroelectric BaTiO3 capacitor", "Mater. Res. Soc. Symp. Proc.", 1993, pp. 249-254, vol. 310.

Co-pending U.S. Appl. No. 12/707,449, filed Feb. 17, 2010.

Co-pending U.S. Appl. No. 11/949,871.

TANTALUM AMIDO-COMPLEXES WITH CHELATE LIGANDS USEFUL FOR CVD AND ALD OF TAN AND TA$_2$O$_5$ THIN FILMS

CROSS-REFERENCE TO RELATED APPLICATION

This is a divisional under 35 USC 120 of U.S. patent application Ser. No. 12/013,433 filed Jan. 12, 2008 in the names of Tianniu Chen, et al. for "TANTALUM AMIDO-COMPLEXES WITH CHELATE LIGANDS USEFUL FOR CVD AND ALD OF TaN AND Ta$_2$O$_5$," now U.S. Pat. No. 7,750,173 issued Jul. 6, 2010, which in turn claims the benefit of priority under 35 USC 119 of U.S. Provisional Patent Application 60/885,459 filed Jan. 18, 2007 in the names of Tianniu Chen, et al. for "TANTALUM AMIDO-COMPLEXES WITH CHELATE LIGANDS USEFUL FOR CVD AND ALD OF TaN AND Ta$_2$O$_5$." The disclosures of said U.S. Pat. No. 7,750,173 and said U.S. Provisional Patent Application 60/885,459 are hereby incorporated herein by reference, in their respective entireties, for all purposes.

BACKGROUND OF THE INVENTION

1. Field of the Invention

The present invention relates to precursor compositions that are useful for forming tantalum-containing films, e.g., by chemical vapor deposition (CVD) or atomic layer deposition (ALD), as well as to tantalum-containing barrier layers or films and to copper-metallized semiconductor device structures including tantalum-containing layers or films.

2. Description of the Related Art

In the field of semiconductor manufacturing, copper (Cu) and low k dielectrics are being increasingly employed in high performance silicon integrated circuits. Since Cu is very mobile in silicon (Si) and silicon dioxide (SiO$_2$), effective diffusion barriers against Cu migration are required for the use of Cu metallization, inasmuch as the copper/interlayer dielectric interface determines the stability and reliability of the metallization scheme.

A variety of refractory metals, refractory metal nitrides, and metal-silicon-nitrogen compounds have been intensively investigated for use as barrier material. See, for example, U.S. Pat. No. 6,951,804 to Seutter et al. and U.S. Pat. No. 6,960,675 to Chen et al. Each of these U.S. patents is incorporated herein by reference in their entirety.

Among such materials, tantalum (Ta) and tantalum nitrides (TaN) are considered to be among the most promising candidates because of their stability under high temperature, high degree of adhesion, low resistivity, uniformity of their films and their inertness towards Cu.

As the size of the pattern shrinks and the aspect ratio increases, vapor deposition techniques, e.g., chemical vapor deposition (CVD), atomic layer deposition (ALD), digital CVD, pulsed CVD, or the like, are necessary to deposit the barrier layer, in order to minimize barrier layer thickness while achieving effective barrier properties.

Against this background of continuous shrinkage in feature size and progressive increase in aspect ratio, chemical vapor deposition (CVD) and atomic layer deposition (ALD) are increasingly preferred for depositing thin, conformal and smooth barrier layers in vias and trenches. For such applications, suitable tantalum precursors are required for forming tantalum-containing barrier material on substrates.

From a practical standpoint, Ta amides, such as, PDMAT [Ta(NMe$_2$)$_5$], and PEMAT [Ta(NEtMe)$_5$] and Ta imides, such as, TBTDET [t-BuN=Ta(NEt$_2$)$_3$], and TAIMATA [t-AmN=Ta(NMe$_2$)$_3$] represent some currently available TaN precursors. Thermal stability of amides is problematic. For example, PDMAT is a solid with a melting point of 167° C. However, PDMAT decomposes at temperatures above 80° C. PEMAT is a low melting point solid. PEMAT also decomposes at temperatures above 80° C.

There is a continuing need in the art for tantalum precursors useful for deposition applications, e.g., to form copper migration barrier structures.

In current practice, copper migration barrier structures are formed by reactive sputter deposition of a TaN layer onto a patterned, nominally dense dielectric, followed by sputter deposition of Ta metal prior to sputter deposition of a copper seed layer.

There is correspondingly a need for barrier layers, e.g., for copper metallization of semiconductor device structures, that do not introduce nitrogen to the underlying dielectric film.

SUMMARY OF THE INVENTION

Aspects of various embodiments of the present invention relate generally to precursor compositions for forming tantalum-containing films, as well as to the tantalum-containing films, such as may be employed as barrier layers in semiconductor devices utilizing copper metallization, as well as to semiconductor device structures including tantalum-containing films.

In one aspect, an embodiment of the present invention relates to a tantalum compound of Formula I:

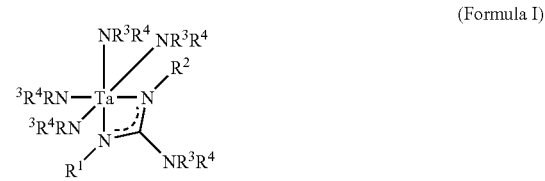

(Formula I)

wherein:

R$^1$, R$^2$, R$^3$ and R$^4$ can be the same as or different from one another, and each is independently selected from the group consisting of hydrocarbyl, alkyl, silyl, and, alkylamino.

In some embodiments, in Formula I, R$^1$ and R$^2$ cannot both be isopropyl at the same time and/or R$^1$ and R$^2$ cannot both be cyclohexyl at the same time.

One or more embodiments of the invention in another aspect relate to a tantalum precursor formulation, including a tantalum compound (Formulae I) as described above, in a solvent medium.

An example of a suitable solvent medium is an organic solvent, including but not limited to, hydrocarbon solvents such as pentane, hexane, heptane, octane, decane, THF, ether (e.g., dimethylether (DME)) and aromatic solvents such as toluene.

Other suitable solvents may be used.

In a further aspect, embodiments of the invention relate to a method of synthesizing a tantalum compound (Formula I) as described above, in which the method includes conducting synthesis according to Scheme 1 or Scheme 1a below:

(Scheme 1)

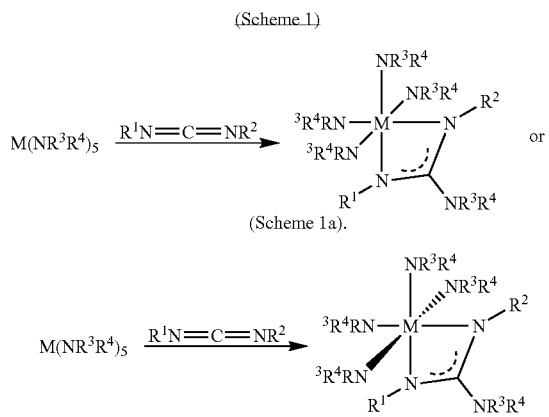

(Scheme 1a).

where M=Ta.

A still further aspect of embodiments of the invention relate to a method of forming a tantalum-containing material on a substrate, including volatilizing a tantalum compound of Formula I as described above, to form a precursor vapor, and depositing tantalum on the substrate from the precursor vapor under deposition conditions therefor.

It is to be appreciated, however, that (according to one or more embodiments of the invention) the tantalum-containing material on a substrate, the tantalum-containing barrier layer on a substrate, or devices containing same, or methods for making the same, may involve (in whole, or in part) the tantalum compounds of Formula I.

In another aspect, one or more embodiments of the present invention relate to a semiconductor device structure, including a dielectric layer, a barrier layer overlying (or, for example, directly on) the dielectric layer, and a copper metallization overlying (or, for example, directly on) the barrier layer, wherein the barrier layer is optionally amorphous. See, for example, FIG. 5 hereof.

A still further aspect of one or more embodiments of the invention relates to a method of forming a Ta-containing barrier layer on a dielectric layer which, in turn, is on a substrate. The Ta-containing barrier layer may be formed by a process including CVD or ALD using precursors of Formula I as described herein. According to one embodiment of the present invention, the CVD or ALD is conducted at a temperature below about 400° C., in a reducing atmosphere.

Yet another aspect of one or more embodiments of the invention relates to a method of inhibiting copper migration in a structure including copper and material adversely affected by copper migration (and/or improving poor adhesion between the copper layer and the barrier layer underneath), comprising interposing a Ta-containing barrier layer between said copper and such material using precursors of Formula I as described herein. According to one embodiment of the present invention, the CVD or ALD is conducted at a temperature below about 400° C., in a reducing atmosphere (e.g., a suitable nitriding atmosphere such as $NH_3$—for example—ammonia gas or ammonia plasma).

Additional aspects of one or more embodiments of the present invention relate to making a semiconductor device, comprising forming a migration barrier by a vapor deposition process using a vapor deposition precursor including a tantalum compound (Formula I) as described herein, and semiconductor manufacturing methods including use of a tantalum compounds of such type.

The metal source precursors of the invention are volatile and thermally stable, and are usefully employed as precursors for CVD, ALD and/or digital CVD (sometimes referred to as rapid vapor deposition, or RVD) under reduced pressure deposition conditions in corresponding CVD, ALD or digital CVD reactors. In digital CDV, as in ALD, the substrate is sequentially exposed precursors in gaseous form. In digital CDV the process is repeated until a substrate coated with multiple layers reaches a desired thickness. The resulting coated substrate has a high conformality. Digital CVD differs from ALD in that the layers in digital CVD can be deposited more quickly.

The compositions of the present invention can be delivered to the CVD, ALD or digital CVD reactors in a variety of ways. For example, a liquid delivery system may be utilized, with the solid precursor(s) being dissolved in organic solvents, and liquid delivery processes being used to meter the solution into a vaporizer for transport of the vapor to the reactor. Alternatively, a combined liquid delivery and flash vaporization process unit may be employed, to enable low volatility materials to be volumetrically delivered, so that reproducible transport and deposition are achieved without thermal decomposition of the precursor, in order to provide a commercially acceptable CVD, ALD or digital CVD process. In still another alternative, a liquid delivery system may be utilized wherein the precursor is stored in and delivered from an ionic liquid.

In liquid delivery formulations, metal source precursors that are liquids may be used in neat liquid form, or liquid or solid metal source precursors may be employed in solvent formulations containing same. Thus, metal source precursor formulations of the invention may include solvent component(s) of suitable character as may be desirable and advantageous in a given end use application to form metals on a substrate.

Suitable solvents may for example include alkane solvents (e.g., hexane, heptane, octane, nonane, decane and pentane), aryl solvents (e.g., benzene or toluene), amines (e.g., triethylamine, tert-butylamine), imines and carbodiimides (e.g., N,N'-diisopropylcarbodiimide). The utility of specific solvent compositions for particular metal source precursors may be readily empirically determined, to select an appropriate single component or multiple component solvent medium for the liquid delivery vaporization and transport of the specific metal source precursor that is employed. In some embodiments, oxygenated species such as alcohols, ethers, ketones, aldehydes, and other species that might serve as coordinating species, can be employed.

In specific embodiments, the solvent utilized in the source reagent solutions of the invention are selected from among aliphatic hydrocarbons, aromatic hydrocarbons, ethers, esters, nitriles, and alcohols. The solvent component of the solution can comprise a solvent selected from the group consisting of: glyme solvents having from 1 to 20 ethoxy —$(C_2H_4O)$— repeat units; $C_2$-$C_{12}$ alkanols, organic ethers selected from the group consisting of dialkyl ethers comprising $C_1$-$C_6$ alkyl moieties, $C_4$-$C_8$ cyclic ethers; $C_{12}$-$C_{60}$-crown-$O_4$—$O_{20}$ ethers wherein the prefixed $C_i$ range is the number i of carbon atoms in the ether compound and the suffixed $O_i$ range is the number i of oxygen atoms in the ether compound; $C_6$-$C_{12}$ aliphatic hydrocarbons; $C_6$-$C_{18}$ aromatic hydrocarbons; organic esters; organic amines; and polyamines.

In another aspect of the invention, a solid delivery system may be utilized, for example, using the ProE-Vap® solid delivery and vaporizer unit (commercially available from ATMI, Inc., Danbury, Conn., USA).

In another aspect of the invention, a liquid delivery system may be utilized, for example using the NOWTrak® system (commercially available from ATMI, Inc., Danbury, Conn., USA). In still another aspect of the invention, the packaging utilized in liquid delivery employing the NOWTrak® system includes a disposable liner adapted to hold the liquid precursor composition. Exemplary systems include, but are not limited to, those set forth in U.S. Pat. No. 6,879,876, filed Jun. 13, 2001 and issued Apr. 12, 2005 and titled "Liquid handling system with electronic information storage"; U.S. patent application Ser. No. 10/139,104, filed May 3, 2002 and titled "Liquid handling system with electronic information storage"; U.S. patent application Ser. No. 10/742,125, filed Dec. 19, 2003 and titled "Secure Reader System"; and U.S. Provisional Patent Application No. 60/819,681 filed Jul. 10, 2006 entitled "Fluid storage vessel management systems and methods employing electronic information storage," all of which are hereby incorporated by reference in their entirety.

Other non-limiting aspects, features and advantages of the present invention will be more fully apparent from the ensuing disclosure and appended claims.

DETAILED DESCRIPTION OF THE INVENTION, AND PREFERRED EMBODIMENTS THEREOF

Figure 1:
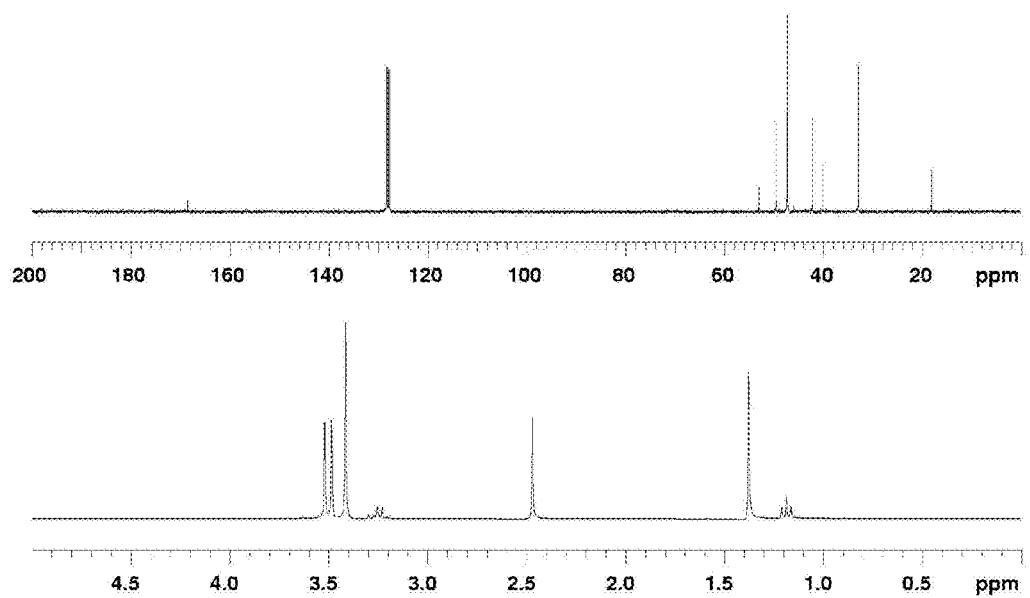
FIG. 1 includes the $^1$H & $^{13}$C NMRs of [(Bu$^t$NC(NMe$_2$)NEt)Ta(NMe$_2$)$_4$]. The top plot is the $^{13}$C NMR. The bottom plot is the $^1$H NMR.

One or more embodiments of the present invention relate in various aspects to precursor compositions (and vapor, gas or plasma forms thereof) useful for forming tantalum-containing films (e.g., barrier layers or films). Other embodiments relate to tantalum-containing films, such as may be employed as barrier layers in semiconductor devices utilizing copper metallization, as well as to other semiconductor device structures including tantalum-containing films.

As used herein, the term "semiconductor device structures" is intended to be broadly construed to include microelectronic devices, products, components, assemblies and subassemblies that include a semiconductor material as a functional material therein. Illustrative examples of semiconductor device structures include, without limitation, resist-coated semiconductor substrates, flat-panel displays, thin-film recording heads, microelectromechanical systems (MEMS), and other advanced microelectronic components. The semiconductor device structure may include patterned and/or blanketed silicon wafers, flat-panel display substrates or fluoropolymer substrates. Further, the semiconductor device structure may include mesoporous or microporous inorganic solids.

"Alkyls" as used herein include, but are not limited to, methyl, ethyl, propyl, isopropyl, butyl, s-butyl, t-butyl, pentyl and isopentyl and the like. "Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like. "Cycloalkyls" as used herein include, but are not limited to cyclopropyl, cyclobutyl, cyclopentyl, cyclohexyl and the like. In all chemical formulae herein, a range of carbon numbers will be regarded as specifying a sequence of consecutive alternative carbon-containing moieties, including all moieties containing numbers of carbon atoms intermediate the endpoint values of carbon number in the specific range as well as moieties containing numbers of carbon atoms equal to an endpoint value of the specific range, e.g., $C_1$-$C_6$, is inclusive of $C_1$, $C_2$, $C_3$, $C_4$, $C_5$ and $C_6$, and each of such broader ranges may be further limitingly specified with reference to carbon numbers within such ranges, as sub-ranges thereof. Thus, for example, the range $C_1$-$C_6$ would be inclusive of and can be further limited by specification of sub-ranges such as $C_1$-$C_3$, $C_1$-$C_4$, $C_2$-$C_6$, $C_4$-$C_6$, etc. within the scope of the broader range.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

It is noted that as used herein and in the appended claims, the singular forms "a", "and", and "the" include plural referents unless the context clearly dictates otherwise.

The invention, as variously described herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention.

One or more embodiments of the present invention relate to a class of precursors selected from among precursors of Formula I below:

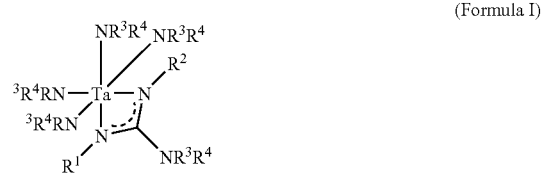

(Formula I)

wherein:

$R^1$, $R^2$, $R^3$ and $R^4$ can be the same as or different from one another, and each is independently selected from the group consisting of hydrocarbyl, alkyl, silyl, and alkylamino. In some embodiments, $R^1$ and $R^2$ cannot both be isopropyl at the same time and/or $R^1$ and $R^2$ cannot both be cyclohexyl at the same time.

Additionally, according to one or more embodiments of the present invention, $R^1$, $R^2$, $R^3$ and $R^4$ can be the same as or different from one another, and each is independently selected from hydrocarbyl (e.g., $C_1$-$C_{12}$ alkyl such as $C_1$ alkyl (i.e., methyl), $C_2$ alkyl (i.e., ethyl), $C_3$ alkyl (e.g., n-propyl or iso-propyl), $C_4$ alkyl (e.g., n-butyl, iso-butyl, t-butyl), $C_5$ alkyl (e.g., n-pentyl, iso-pentyl), $C_8$ alkyl (e.g., octyl), $C_9$ alkyl (e.g., nonyl), $C_{10}$ alkyl, $C_{11}$ alkyl, $C_{12}$ alkyl), alkenyl (e.g., $C_1$-$C_{12}$ alkenyl), and aryl and any combination or sub-combination thereof), hydrogen, silyl, hydrazyl (for example $Me_2NNH-$) and alkylamino (for example $Me_2N-$, MeHN—, etc.).

As used herein, the designation of organo substituents by reference to carbon numbers, includes ranges as well as sub-ranges within the ranges identified by end-point carbon numbers, and such sub-ranges may be specified, e.g., as including one of such end-point carbon numbers in such a sub-range, or as including carbon numbers greater than the lower end-point carbon number and less than the upper end-point carbon number of the range, to constitute various sub-ranges in the various specific embodiments of the invention. Alkyl groups may be branched or unbranched.

The precursors of Formula I (described herein) are useful for forming tantalum-containing films, e.g., involving CVD and ALD of tantalum nitride and Ta metal films. These precursors also have utility as low temperature deposition precursors for forming $Ta_2O_5$ and other Ta oxide films, e.g., in the fabrication of capacitors such as back-end capacitors.

These novel complexes may be readily purified, and their solution behavior in solvent media employed for liquid delivery processes, e.g., for CVD or ALD of Ta, TaN or $Ta_2O_5$ films is superior to that of PDMAT [$Ta(NMe_2)_5$], PEMAT [$Ta(NEtMe)_5$], etc.

The precursors of Formula I may be usefully employed for deposition of Ta-containing material on substrates, including, without limitation, deposition of Ta, TaN, $Ta_2O_5$, TaSiN, $BiTaO_4$, etc. The Ta-containing material may be deposited on the substrate in any suitable manner, with deposition processes such as CVD and ALD sometimes being preferred. Depending on the substituents employed, the Formula I precursors may also be deposited by solid delivery techniques, e.g., in which the precursor is volatilized from a solid form under suitable temperature and pressure, e.g., vacuum conditions.

The CVD process may be carried out in any suitable manner, for example, with the volatilized precursor being conveyed to a CVD reactor for contact with a heated substrate, e.g., a silicon wafer-based structure, or other microelectronic device substrate. In such process, the volatilized precursor may be directed to the CVD reactor in neat form, or, more typically, in a carrier gas stream, which may include inert gas, plasma, oxidant, reductant, co-deposition species, and/or the like.

The CVD process may be carried out by liquid delivery processing, for example, in which the Ta precursor is dissolved or suspended in a solvent medium, which may include a single solvent or multi-solvent composition, as appropriate to the specific deposition application involved. Suitable solvents for such purpose include any compatible solvents that are consistent with liquid delivery processing, as for example, hydrocarbon solvents, etc., with a suitable solvent for the specific deposition application being readily determinable within the skill of the art based on the disclosure herein.

The precursors of Formula I have particular utility as CVD or ALD precursors for deposition of thin films of TaN and TaSiN as barriers in integrated circuits, e.g., integrated circuitry including dielectric material and copper metallization.

The precursors of Formula I, and Formula II (i.e., $M(NR^3R^4)_5$; M=Ta or as described herein; $R^3$ and $R^4$ are as described herein) also may have particular utility as CVD or ALD precursors for low temperature deposition of thin films of high k capacitor materials such as $Ta_2O_5$ and $BiTaO_4$.

The precursors of Formula I may also have particular utility as CVD or ALD precursors for deposition of Ta containing metal films as barriers in integrated circuits.

Various embodiments of the present invention include a class of precursors selected from among precursors of Formula I described above. Additionally, according to one or more embodiments of the present invention, $R^1$, $R^2$, $R^3$ and $R^4$ can be the same as or different from one another, and each is independently selected from hydrocarbyl substituents including alkyl, arylalkyl, alkaryl, alkenyl, alkenylaryl, arylalkenyl, allyl, hydrogen, silyl, hydrazyl (for example, $Me_2NNH-$) and alkylamino (for example, $Me_2N-$, MeHN—, etc.) etc. that are optionally further substituted with one or more heteroatoms such as N, S, and O and/or with halo substituents and any combination or sub-combination thereof, and providing functionality that is sterically and chemically appropriate to the use of the composition as a precursor for forming tantalum-containing films and materials—as described herein.

The precursors of Formula I have utility for CVD and ALD of Ta carbide and Ta metal films, as well as for low temperature deposition of TaN, $Ta_2O_5$ and other Ta-related oxide films for use in capacitor fabrication.

The precursors of Formula I can be synthesized by Scheme 1 or Scheme 1a below:

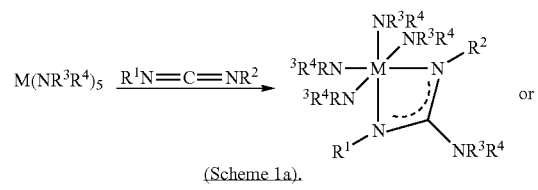

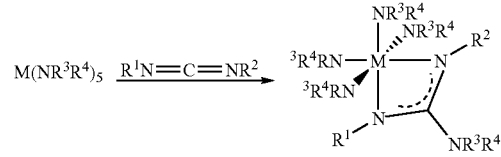

In such synthetic schemes, $R^1$, $R^2$, $R^3$, and $R^4$ are as described herein and M is tantalum.

The Formula I precursors are thermally stable and stable in solution. The $R^1$, $R^2$, $R^3$, and $R^4$ ligands may be appropriately selected for the specific deposition application employed, e.g., for CVD or ALD deposition processing to form the desired Ta-containing material on the deposition substrate, within the skill of the art—based on the disclosure herein. The Formula I precursors are readily purified, and their solution behavior in solvent media may be suitably employed for liquid delivery processes, e.g., for CVD or ALD of Ta, TaN or $Ta_2O_5$ films.

The precursors of Formula I have utility as CVD or ALD precursors for deposition of thin films of TaN and TaSiN as barriers in integrated circuits, e.g., integrated circuitry including dielectric material and copper metallization.

The precursors of Formula I also have particular utility as CVD or ALD precursors for low temperature deposition of thin films of high k capacitor materials such as $Ta_2O_5$ and $BiTaO_4$.

The precursors of Formula I have utility for CVD and ALD of Ta nitride and Ta metal films, as well as for low temperature deposition of $Ta_2O_5$ and other Ta-related oxide films for use in capacitor fabrication.

FIG. 1 shows a $^{13}C$ and $^1H$ NMR plot of. [($Bu^tNC(NMe_2)$NEt)$Ta(NMe_2)_4$]. The top plot is the $^{13}C$ NMR. The bottom plot is the $^1H$ NMR.

Figure 2:
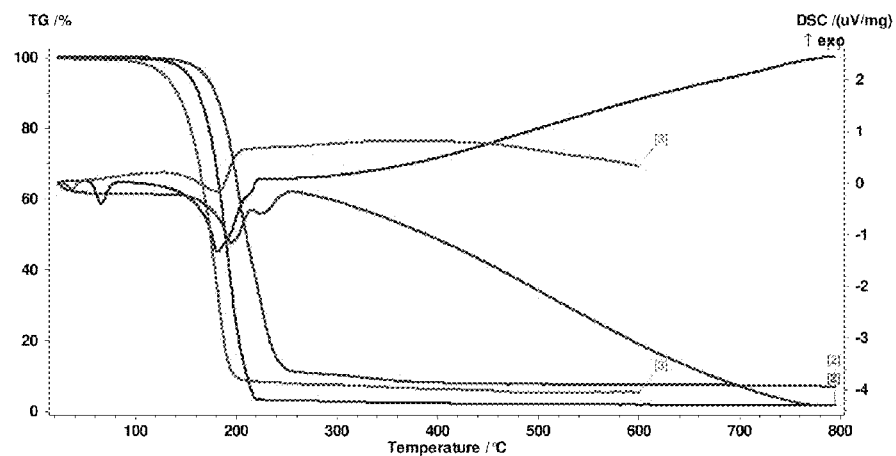
FIG. 2 is an STA (simultaneous thermal analysis) diagram illustrating comparison of STA data among DEMAT (5.15 mg), [(Bu$^t$NC(NMe$_2$)NEt)Ta(NMe$_2$)$_4$] (9.56 mg) and (NMe$_2$)$_4$Ta($\eta$Pr$^i$NC(NMe$_2$)NPr$^i$) (10.57 mg).

FIG. 2 is an STA (simultaneous thermal analysis) diagram illustrating comparison of STA data among DEMAT (green line, 5.15 mg), [($Bu^tNC(NMe_2)$NEt)$Ta(NMe_2)_4$] (blue line, 9.56 mg) and $(NMe_2)_4Ta(\eta 2-Pr^iNC(NMe_2)NPr^i)$ (brown line, 10.57 mg). Thermal analysis (see STA data in FIG. 2) showed the material transport completely below 250° C. with a low residue of 1.6% at 800° C. Notably the introduction of the asymmetric chelate ligand in [($Bu^tNC(NMe_2)$NEt)Ta$(NMe_2)_4$] dropped the $T_{50}$ by 21° C. as compared to that of [($Pr^iNC(NMe_2)NPr^i$)$Ta(NMe_2)_4$], which made it very comparable to DEMAT.

Figure 3:
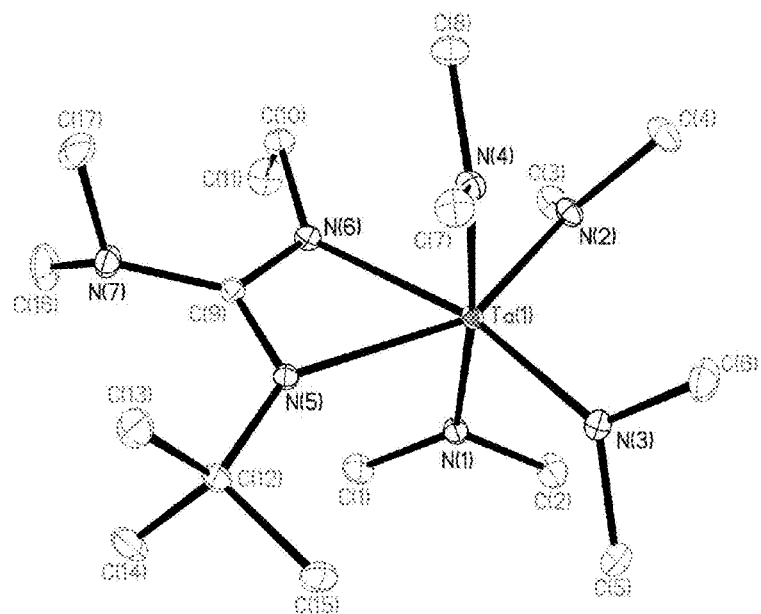
FIG. 3 is an ORTEP diagram of [(Bu$^t$NC(NMe$_2$)NEt)Ta(NMe$_2$)$_4$].

FIG. 3 is an ORTEP diagram of [($Bu^tNC(NMe_2)$NEt)Ta$(NMe_2)_4$]

Figure 4:
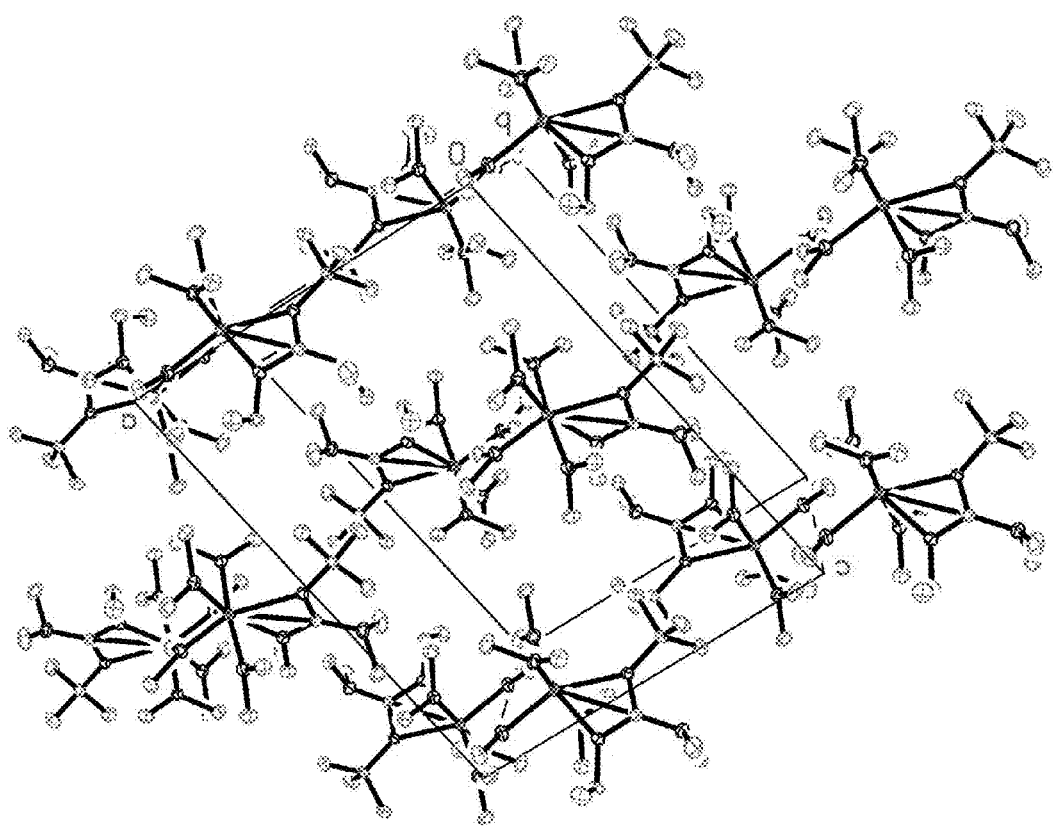
FIG. 4 is a packing diagram of [(Bu$^t$NC(NMe$_2$)NEt)Ta(NMe$_2$)$_4$] along the c axis.

FIG. 4 is a packing diagram of [($Bu^tNC(NMe_2)$NEt)Ta$(NMe_2)_4$] along the c axis.

Figure 5:
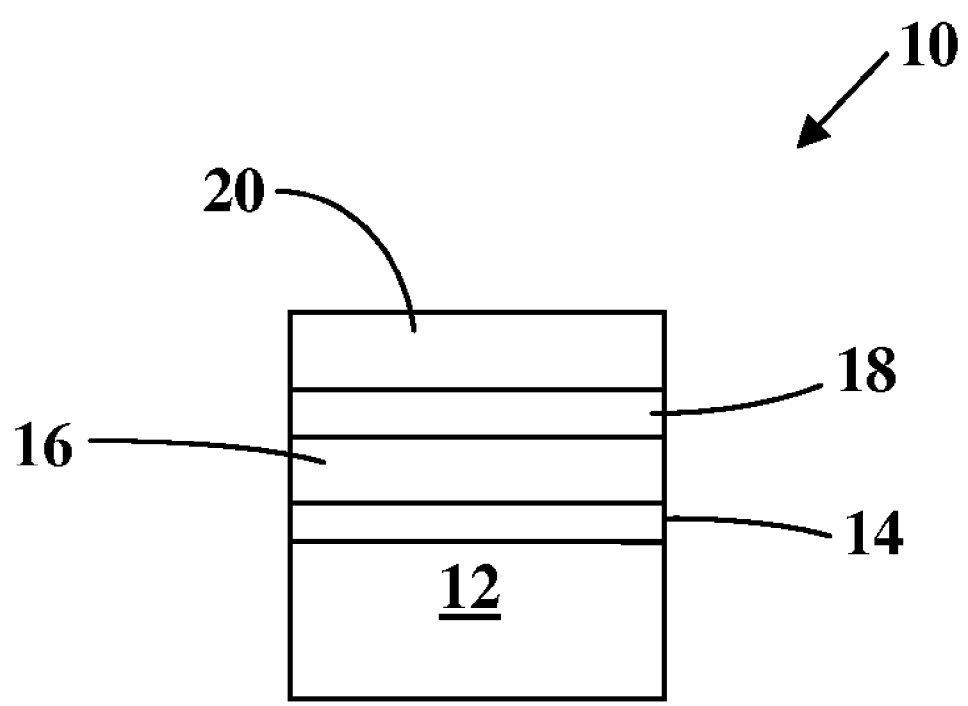
FIG. 5 is a schematic illustration of a semiconductor device structure according to one embodiment of the present invention, featuring an amorphous Ta-containing barrier film and copper metallization.

FIG. 5 is a schematic illustration of a semiconductor device structure according to one embodiment of the present invention, featuring an amorphous Ta-containing barrier film and copper metallization.

As noted, the precursors of Formula I may be usefully employed for deposition of Ta-containing material on substrates, including, without limitation, deposition of Ta, TaN, $Ta_2O_5$, TaSiN, $BiTaO_4$, etc. The Ta-containing material may be deposited on the substrate in any suitable manner, for example, with deposition processes such as CVD and ALD sometimes being preferred. Depending on the substituents employed, the Formula I precursors may also be deposited by solid delivery techniques, e.g., in which the precursor is volatilized from a solid form under suitable temperature and pressure, e.g., vacuum conditions.

The CVD process may be carried out in any suitable manner, with the volatilized precursor being conveyed to a CVD reactor for contact with a heated substrate, e.g., a silicon wafer-based structure, or other microelectronic device substrate. In such process, the volatilized precursor may be directed to the CVD reactor in neat form, or, more typically, in a carrier gas stream, which may include inert gas, plasma, oxidant, reductant, co-deposition species, or the like.

Although the choice of specific process conditions for CVD is readily made by the skilled artisan based on the disclosure herein, it may be suitable in some applications to conduct chemical vapor deposition at process conditions including a deposition temperature range from about 600 to about 900K and a deposition pressure range from about 0 to about 100 Pascal.

The CVD process may be carried out by liquid delivery processing, in which the Ta precursor is dissolved or suspended in a solvent medium, which may include a single solvent or multi-solvent composition, as appropriate to the specific deposition application involved. Suitable solvents for such purpose include any compatible solvents that are consistent with liquid delivery processing, as for example, hydrocarbon solvents, etc., with a suitable solvent for a specific deposition application being readily determinable within the skill of the art based on the disclosure herein. Examples of suitable hydrocarbon solvents include, but are not limited to, pentane, hexane, heptane, octane, decane, cyclohexane, THF, toluene, and DME. Other suitable solvents may be used.

The precursors of Formula I may have particular utility as CVD or ALD precursors for deposition of thin films of TaN and TaSiN as barriers in integrated circuits, e.g., integrated circuitry including dielectric material and copper metallization.

The precursors of Formula I may also have particular utility as CVD or ALD precursors for low temperature deposition of thin films of high k capacitor materials such as $Ta_2O_5$ and $BiTaO_4$.

The precursors of Formula I may also have particular utility as CVD or ALD precursors for deposition of Ta metal films as barriers in integrated circuits.

One or more embodiments of the present invention relate to tantalum-containing barrier films, such as may usefully be employed as diffusion barriers in semiconductor devices featuring copper metallization, and reflects the discovery that Ta compounds (Formula I) can be used to efficiently form tantalum-based barrier films at low temperatures under reducing conditions.

The Ta compounds that can be usefully employed for forming the Ta-containing barrier film may be of any suitable type, including a Ta—$NR^1$—$C(NR^3R^4)$—$NR^2$ (see Formula I and Formula II noted herein containing same) moiety and substituents that permit the Ta-containing barrier film to be formed (in whole or in part)—sometimes preferably as an amorphous structure.

In use, the Ta compound precursor may be volatilized to form a precursor vapor for CVD or ALD formation of the Ta-containing barrier film. The precursor volatilization and delivery to the deposition chamber may be carried out in any suitable manner, e.g., by bubbler delivery involving an inert or reducing carrier gas flow through the bubbler, or by solid delivery technique, in which the precursor is volatilized from a solid form under suitable temperature and pressure, e.g., vacuum conditions involving sublimation of the precursor compound and mixing of the precursor vapor with inert or reducing carrier gas, or by liquid delivery technique in which the precursor is dissolved in a suitable solvent medium, such as hexane, octane, toluene or other organic solvent, with the resulting liquid being flash vaporized to produce the precursor vapor, or by any other appropriate technique that results in the provision of a precursor vapor suitable for contacting with the substrate (the layer to be coated).

The precursor vapor can contain or be mixed with a reducing agent of appropriate character and concentration to provide a suitable reducing atmosphere in the deposition chamber. In the deposition chamber, the substrate on which the barrier film is to be formed, is heated to temperature effective for contacting with the precursor vapor to affect the film formation process, and then contacted with the precursor vapor to form the Ta-containing barrier film on the substrate.

The reducing agent can be hydrogen, hydrogen plasma, remote hydrogen plasma, silane, disilane, borane, diborane, ammonia (gas or plasma), amines ($Me_2NH$, t-$BuNH_2$, $Et_2NH$) or the like, or mixture of two or more of the foregoing species, as satisfactory to provide an atmosphere in the deposition chamber that facilitates the formation of the Ta-containing film. The reducing co-reactants may be introduced simultaneously with the Ta precursor or in an alternating manner (i.e., via digital or pulsed CVD or ALD).

The substrate can be of any appropriate type. In one embodiment, the substrate includes a silicon wafer having a low k dielectric film thereon, suitably patterned for the deposition of the barrier film to accommodate subsequent copper metallization of the semiconductor device structure formed on the wafer.

The deposition may be carried out at temperature to form the Ta-containing barrier layer that is appropriate for the specific technique that is employed for the deposition, e.g., CVD, ALD, digital CVD, pulsed CVD, or the like. In general, temperature of 100° C. or higher, but below 400° C., can be utilized as the deposition temperature.

In some embodiments, the temperature for deposition is below 390° C., and specific operating regimes for the process include temperatures in a range of from about 250° C. to about 380° C., and temperatures in a range of from about 275° C. to about 350° C. in other embodiments of the invention. ALD may for example be carried out at a temperature of about 280° C.

It is to be appreciated that the foregoing values without "about" preceding the specific values are encompassed by this disclosure.

Pressure may likewise be selected based on volatilization, transport and deposition properties of the specific precursor employed, with vacuum pressures being useful in some applications, e.g., where solid delivery is employed as the delivery technique. CVD and ALD pressures may include deposition pressures in a range of from about 0 to about 1000 Pascal, or other pressure appropriate to the particular deposition methodology.

[(Bu$^t$NC(NMe$_2$)NEt)Ta(NMe$_2$)$_4$] is a particularly suitable precursor for low temperature deposition applications for formation of Ta-containing films on substrates.

FIG. 5 is a schematic illustration of a semiconductor device structure 10 according to one embodiment of the present invention, featuring an amorphous Ta-containing barrier film and copper metallization.

The device structure 10 includes a silicon substrate 12, on which has been deposited a low k dielectric material 14. An amorphous barrier film 16 is deposited on the dielectric in accordance with an embodiment of the invention, and overlaid with a seed layer 18 of copper or ruthenium, on which is deposited a copper metallization layer 20. The barrier film (e.g., Ta-containing film or layer) may be of any suitable thickness, e.g., from about 10 Angstroms to about 1000 Angstroms, or greater, depending on the nature of the dielectric and the overall processing scheme including process temperature in the other fabrication steps of the device manufacturing operation.

In an alternative embodiment, the seed layer may be composed of ruthenium or other suitable seed for deposition of copper metallization.

Thus, a precursor compound of Formula I may be used to efficiently and cost-effectively deposit a tantalum-containing film in a reducing atmosphere at low temperature, to produce an amorphous Ta-containing barrier against copper diffusion, in semiconductor device structures featuring copper metallization. The invention thereby achieves a significant advance in the art of copper metallization using thermally stable Ta-containing precursors to form corresponding barrier layers in the device structure.

The R group substituents of tantalum compounds of Formula I hereof can further include variations and derivatives of the chemical moieties specifically identified herein, e.g., in respect of hydrocarbyl substituents including alkyl, arylalkyl, alkaryl, alkenyl, alkenylaryl, arylalkenyl, allyl, hydrogen, silyl, hydrazyl (for example, Me$_2$NH—) and alkylamino (for example, Me$_2$N—, MeHN—, etc.) etc. that are optionally further substituted with heteroatoms such as N, S, and O and/or with halo substituents, providing functionality that is sterically and chemically appropriate to the use of the tantalum composition as a precursor for forming tantalum-containing films and materials.

The tantalum compositions of the invention can be utilized in solution including any suitable solvents, such as for example hydrocarbon solvents (pentane, hexane, heptane, octane, decane, cyclohexane, etc.), THF, ethers (e.g., DME), toluene and the like, as necessary or desirable in a given application of a specific tantalum composition of the invention.

The following example is non-limiting and provided for illustration only.

Example 1

Synthesis of [(Bu$^t$NC(NMe$_2$)NEt)Ta(NMe$_2$)$_4$]

To a 250 mL flask filled with 1.16 g (9.19 mol) 1-tert-Butyl-3-ethylcarbodiimide (Bu$^t$N=C=NEt) and 100 mL hexane, 3.73 g (9.29 mmol) of PDMAT (Ta(NMe$_2$)$_5$), was added at 0° C. The green-yellow reaction mixture was stirred and warmed up during overnight. All the volatiles were then removed under vacuum.

The resulting bright yellow solid was sublimed under vacuum (100° C., 100 mTorr) and 3.4 g yellow solid [(Bu$^t$NC(NMe$_2$)NEt)Ta(NMe$_2$)$_4$] (6.44 mol, 70% overall yield). Data for [(Bu$^t$NC(NMe$_2$)NEt)Ta(NMe$_2$)$_4$]: $^1$H NMR (benzene-d6, 21C): 1.19 (t, 3H, NCH$_2$CH$_3$), 1.38 (s, 9H, NC(CH$_3$)$_3$), 2.47 (s, 6H, CN(CH$_3$)$_2$), 3.25 (q, 2H, NCH$_2$CH$_3$), 3.41 (s, 12H, N(CH$_3$)$_2$), 3.49 (s, 6H, N(CH$_3$)$_2$) 3.52 (s, 6H, N(CH$_3$)$_2$), 13C{1H} NMR (benzene-d6, 21C): 18.18 (NCH$_2$CH$_3$), 32.17 (NCH$_2$CH$_3$), 40.17 (NC(CH$_3$)$_3$), 42.19 (NC(CH$_3$)$_3$), 47.29 (N(CH$_3$)$_2$), 47.39 (N(CH$_3$)$_2$), 49.58 (N(CH$_3$)$_2$), 53.13 (CN(CH$_3$)$_2$), 168.55 (CN(CH$_3$)$_2$). See FIG. 1. Anal. Calcd for TaC$_{17}$H$_{44}$N$_7$: C, 38.71%; H, 8.41%; N, 18.59%. Found: C, 38.55%; H, 8.50%; N, 18.26%.

Although the invention has been described herein with reference to non-limiting illustrative features, aspects and embodiments, it will be appreciated that the invention may be practiced with modifications, variations and in other embodiments, as will suggest themselves to those of ordinary skill based on the disclosure herein. The invention therefore is to be interpreted and construed, as encompassing all such modifications, variations, and other embodiments, within the spirit and scope of the claims hereafter set forth.

What is claimed is:

1. A method for making a tantalum compound of Formula I:

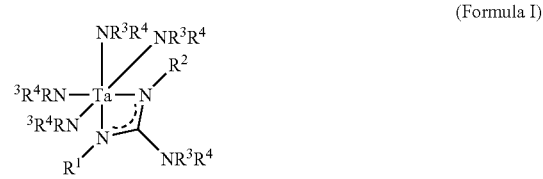

(Formula I)

wherein:
R$^1$, R$^2$, R$^3$ and R$^4$ can be the same as or different from one another, and each is independently selected from the group consisting of hydrogen, hydrocarbyl, alkyl, silyl, alkylamino, alkenyl, aryl and hydrazyl, with the provisos that R$^1$=R$^2$≠iso-propyl, and R$^1$=R$^2$≠cyclohexyl; wherein said R$^1$, R$^2$, R$^3$ and R$^4$ may be optionally further substituted with a N, S, O, or a halogen atom, said method comprising the step of:

(a) reacting a compound of Formula II below:

M(NR$^3$R$^4$)$_5$         (Formula II), with a compound of Formula III:

R$^1$N=C=NR$^2$         (Formula III), wherein M is tantalum and $R^1$, $R^2$, $R^3$ and $R^4$ are as indicated above.

2. The method of claim 1, having one or more compatible characteristics selected from the group consisting of:
    (i) said reacting step (a) being conducted in an organic solvent and said compound of Formula III being added to said compound of Formula II in said organic solvent;
    (ii) said reacting step (a) being conducted in an organic solvent selected from the group consisting of pentane, hexane, heptane, octane, decane, cyclohexane, THF, toluene, and DME;
    (iii) said reacting step (a) being conducted in a temperature range from about 0° C. to about 200° C.;
    (iv) said reacting step (a) being conducted in a temperature range from about 0° C. to about 150° C.;
    (v) said reacting step (a) being conducted in a temperature range from about 0° C. to about 100° C.;
    (vi) said reacting step (a) being conducted in a temperature range from about 0° C. to about 75° C.;
    (vii) said reacting step (a) being conducted in a temperature range from about 0° C. to about 50° C.;
    (viii) said reacting step (a) being conducted in a temperature range from about 0° C. to about 30° C.;
    (ix) said alkyl being a $C_1$-$C_{12}$ alkyl selected from the group consisting of $C_1$ alkyl, $C_2$ alkyl, $C_3$ alkyl, $C_4$ alkyl, $C_5$ alkyl, $C_6$ alkyl, $C_7$ alkyl, $C_8$ alkyl, $C_9$ alkyl, $C_{10}$ alkyl, $C_{11}$ alkyl or $C_{12}$ alkyl;
    (x) said alkyl being a $C_1$-$C_4$ alkyl selected from the group consisting of $C_1$ alkyl, $C_2$ alkyl, $C_3$ alkyl and $C_4$ alkyl;
    (xi) said alkyl being methyl, ethyl, n-propyl, i-propyl, n-butyl, or t-butyl;
    (xii) said $R^1$ and $R^2$ being the same and said $R^3$ and $R^4$ being the same but said $R^1$ and $R^2$ not being the same as said $R^3$ and $R^4$;
    (xiii) said $R^1$ and $R^2$ not being the same but said $R^3$ and $R^4$ being the same;
    (xiv) said $R^1$ and $R^2$ being the same but said $R^3$ and $R^4$ not being the same;
    (xv) said $R^1$, $R^2$, $R^3$ and $R^4$ being the same;
    (xvi) none of $R^1$, $R^2$, $R^3$ and $R^4$ being the same; and
    (xvii) some of said $R^1$, $R^2$, $R^3$ and $R^4$ being the same.

3. The method of claim 1, wherein said reacting step (a) is conducted in a hydrocarbon solvent.

4. The method of claim 3, wherein said hydrocarbon solvent is selected from the group consisting of pentane, hexane, heptane, octane, decane, cyclohexane, THF, toluene, and ethers.

5. The method of claim 3, wherein said hydrocarbon solvent is selected from the group consisting of pentane, heptane, octane, decane, cyclohexane, THF, toluene, and ethers.

6. The method of claim 1, wherein said reacting step (a) is conducted in dimethylether (DME).

7. The method of claim 1, wherein each of $R^1$, $R^2$, $R^3$ and $R^4$ is independently selected from the group consisting of hydrocarbyl, alkyl, silyl, and alkylamino.

8. The method of claim 1, wherein each of $R^1$, $R^2$, $R^3$ and $R^4$ is independently selected from the group consisting of alkyl, arylalkyl, alkaryl, alkenyl, alkenylaryl, arylalkenyl, allyl, hydrogen, silyl, hydrazyl, and alkylamino.

9. The method of claim 1, wherein said tantalum compound is $(Bu^tNC(NMe_2)NEt)Ta(NMe_2)_4$.

10. The method of claim 1, wherein the tantalum compound includes asymmetric chelate ligands $R^1$ and $R^2$.

11. The method of claim 10, wherein both chelate ligands $R^1$ and $R^2$ are alkyl ligands.

12. The method of claim 11, wherein one of said chelate ligands $R^1$ and $R^2$ is ethyl.

13. The method of claim 11, wherein one of said chelate ligands $R^1$ and $R^2$ is t-butyl.

14. The method of claim 11, wherein the tantalum compound displays simultaneous thermal analysis (STA) behavior including complete material transport below 250° C.

15. The method of claim 10, wherein $R^3 = R^4 =$ methyl.

16. A method of making $[(Bu^tNC(NMe_2)NEt)Ta(NMe_2)_4]$, comprising reacting $Bu^tN=C=NEt$ and $Ta(NMe_2)_5$ in a reaction medium comprising solvent, and recovering said $[(Bu^tNC(NMe_2)NEt)Ta(NMe_2)_4]$ under vacuum from said reaction medium.

17. The method of claim 16, wherein said solvent comprises a hydrocarbon solvent.

18. The method of claim 17, wherein said hydrocarbon solvent is selected from the group consisting of pentane, hexane, heptane, octane, decane, cyclohexane, THF, toluene, and ethers.

19. The method of claim 17, wherein said hydrocarbon solvent is selected from the group consisting of pentane, heptane, octane, decane, cyclohexane, THF, toluene, and ethers.

20. The method of claim 16, wherein said solvent comprises hexane.

* * * * *

UNITED STATES PATENT AND TRADEMARK OFFICE
CERTIFICATE OF CORRECTION

Page 1 of 1

PATENT NO. : 7,858,816 B2
APPLICATION NO. : 12/790835
DATED : December 28, 2010
INVENTOR(S) : Tianniu Chen It is certified that error appears in the above-identified patent and that said Letters Patent is hereby corrected as shown below:

On the Title Page

Item (54) Title: "TAN and $TA_2O_5$" should be -- TaN and $Ta_2O_5$ --.

Column 1, line 3, "TAN and $TA_2O_5$" should be -- TaN and $Ta_2O_5$ --.

Signed and Sealed this
Eighth Day of March, 2011

David J. Kappos
*Director of the United States Patent and Trademark Office*